(12) United States Patent
Li

(10) Patent No.: US 12,342,690 B2
(45) Date of Patent: Jun. 24, 2025

(54) DISPLAY APPARATUS WITH LIGHT-SHIELDING PORTION ADJOINING SUBSTRATE AND ANODE, MANUFACTURING METHOD FOR DISPLAY APPARATUS, AND ELECTRONIC DEVICE

(71) Applicant: GUANGDONG OPPO MOBILE TELECOMMUNICATIONS CORP., LTD., Dongguan (CN)

(72) Inventor: Zhilin Li, Dongguan (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 446 days.

(21) Appl. No.: 18/076,748

(22) Filed: Dec. 7, 2022

(65) Prior Publication Data

US 2023/0094225 A1   Mar. 30, 2023

Related U.S. Application Data

(63) Continuation of application No. PCT/CN2021/087300, filed on Apr. 14, 2021.

(30) Foreign Application Priority Data

Jun. 8, 2020 (CN) .......................... 202010514069.1
Jun. 8, 2020 (CN) .......................... 202021041167.X

(51) Int. Cl.
*H10K 59/126* (2023.01)
*H10D 86/40* (2025.01)
(Continued)

(52) U.S. Cl.
CPC ......... *H10K 59/126* (2023.02); *H10D 86/441* (2025.01); *H10D 86/60* (2025.01);
(Continued)

(58) Field of Classification Search
CPC .............. H10K 50/818; H10K 59/121; H10K 59/1213; H10K 59/126; H10K 59/131; H10K 59/80518
(Continued)

(56) References Cited

U.S. PATENT DOCUMENTS

| 2017/0033171 A1 | 2/2017 | Kim et al. |
| 2021/0202621 A1* | 7/2021 | Liang .................. H10K 59/124 |
| 2022/0158140 A1* | 5/2022 | Liu .................... H10K 59/8792 |

FOREIGN PATENT DOCUMENTS

| CN | 107968110 A | 4/2018 |
| CN | 108600421 A | 9/2018 |

(Continued)

OTHER PUBLICATIONS

Extended European Search Report dated Oct. 16, 2023 received in European Patent Application No. EP21820936.9.
(Continued)

*Primary Examiner* — Matthew E. Gordon
(74) *Attorney, Agent, or Firm* — Sheppard, Mullin, Richter & Hampton LLP

(57) ABSTRACT

Embodiments of the present disclosure disclose a display apparatus, a manufacturing method for a display apparatus, and an electronic device. The display apparatus includes a first display region and a second display region which adjoin each other. A light transmittance of the second display region is smaller than a light transmittance of the first display region. The second display region includes a thin film transistor. A light shielding portion is disposed between the first display region and the second display region to shield the thin film transistor in the second display region from being irradiated by a light signal from the first display region.

18 Claims, 14 Drawing Sheets

(51) Int. Cl.
    *H10D 86/60* (2025.01)
    *H10K 50/818* (2023.01)
    *H10K 59/12* (2023.01)
    *H10K 59/121* (2023.01)
    *H10K 59/131* (2023.01)
    *H10K 59/65* (2023.01)
    *H10K 59/80* (2023.01)
    *H10K 71/00* (2023.01)

(52) U.S. Cl.
    CPC ....... *H10K 50/818* (2023.02); *H10K 59/1213* (2023.02); *H10K 59/131* (2023.02); *H10K 71/00* (2023.02); *H10K 59/1201* (2023.02); *H10K 59/65* (2023.02); *H10K 59/80518* (2023.02)

(58) Field of Classification Search
    USPC .......................................................... 257/40
    See application file for complete search history.

(56) References Cited

FOREIGN PATENT DOCUMENTS

| | | | |
|---|---|---|---|
| CN | 108987595 | A | 12/2018 |
| CN | 110189639 | A | 8/2019 |
| CN | 110444125 | A | 11/2019 |
| CN | 110767729 | A | 2/2020 |
| CN | 110955084 | A | 4/2020 |
| CN | 111129102 | A | 5/2020 |
| CN | 111211152 | A | 5/2020 |
| CN | 111584609 | A | 8/2020 |
| EP | 3992954 | A1 | 5/2022 |
| KR | 20050052731 | A | 6/2005 |

OTHER PUBLICATIONS

International Search Report and Written Opinion dated Jul. 9, 2021 in International Application No. PCT/CN2021/087300. English translation attached.
The Grant Notice from corresponding Chinese Application No. 202021041167.X, dated Jan. 13, 2021. English translation attached.
The First Office Action from corresponding Chinese Application No. 202010514069.1, dated Oct. 9, 2024. English translation attached.
CNIPA, Second Office Action for CN Application No. 202010514069.1 mailed on Jan. 26, 2025.
CNIPA, Decision of Rejection for CN Application No. 202010514069.1 mailed on Mar. 28, 2025.

* cited by examiner

DISPLAY APPARATUS WITH LIGHT-SHIELDING PORTION ADJOINING SUBSTRATE AND ANODE, MANUFACTURING METHOD FOR DISPLAY APPARATUS, AND ELECTRONIC DEVICE

CROSS-REFERENCE TO RELATED APPLICATIONS

This application is a continuation of International Application No. PCT/CN2021/087300 entitled "DISPLAY APPARATUS, MANUFACTURING METHOD FOR DISPLAY APPARATUS, AND ELECTRONIC DEVICE" filed on Apr. 14, 2021, which claims priorities to Chinese Patent Application No. 202010514069.1, entitled "DISPLAY APPARATUS, MANUFACTURING METHOD FOR DISPLAY APPARATUS, AND ELECTRONIC DEVICE" filed with CNIPA on Jun. 8, 2020, and Chinese Patent Application No. 202021041167.X, entitled "DISPLAY APPARATUS, AND ELECTRONIC DEVICE" filed with CNIPA on Jun. 8, 2020, all of which are incorporated herein by reference in their entireties.

FIELD

The present disclosure relates to the field of electronic technologies, and more particularly, to a display apparatus, a manufacturing method for a display apparatus, and an electronic device.

BACKGROUND

With the development of communication technologies, electronic devices such as a smart phone become more and more popular. During its use, the electronic device may use a display screen thereof to display a picture.

In order to achieve a better display effect and a better user experience, a front camera is disposed on a back surface of the display screen. The display screen has a light-transparent display region that is corresponding to the front camera. The front camera obtains an external light signal transmitted through the light-transparent display region for imaging. Meanwhile, the light-transparent display region may also display an image to achieve a display effect of a full screen and meet a requirement of front-facing camera shooting.

SUMMARY

An embodiment of the present disclosure provides a display apparatus. The display apparatus has a first display region and a second display region adjoining the first display region. A light transmittance of the second display region is smaller than a light transmittance of the first display region. The display apparatus includes a thin film transistor disposed in the second display region. The display apparatus further includes a light shielding portion disposed between the first display region and the second display region and surrounds the first display region. The light shielding portion is configured to shield the thin film transistor in the second display region from being irradiated by a light signal from the first display region.

An embodiment of the present disclosure further provides a manufacturing method for a display apparatus. The manufacturing method for the display apparatus includes: providing a first substrate; forming a wiring layer on the first substrate; forming a drive layer on the wiring layer, the drive layer including a first part and a second part, and the second part including a thin film transistor, and a gap is formed between the first part and the second part by etching, and a light shielding portion is formed in the gap; forming an anode layer on the drive layer; forming a pixel layer on the anode layer; forming a common electrode layer on the pixel layer; and forming a protection layer on the common electrode layer. A region corresponding to the first part forms a first display region, and a region corresponding to the second part forms a second display region. The thin film transistor in the second display region is shielded from being irradiated by a light signal from the first display region.

An embodiment of the present disclosure further provides a manufacturing method for a display apparatus. The manufacturing method for the display apparatus includes: providing a first substrate; forming a wiring layer on the first substrate; forming a drive layer on the wiring layer, the drive layer including a first part and a second part, and the second part includes a thin film transistor; forming an anode layer on the drive layer, here the anode layer includes a first anode region corresponding to the first part and a second anode region corresponding to the second part, a gap is formed between the first anode region and the second anode region by etching, the gap extends through the drive layer, and a light shielding portion is formed in the gap; forming a pixel layer on the anode layer; forming a common electrode layer on the pixel layer; and forming a protection layer on the common electrode layer. A region corresponding to the first part forms a first display region, and a region corresponding to the second part forms a second display region. The thin film transistor in the second display region is shielded from being irradiated by a light signal from the first display region.

An embodiment of the present disclosure further provides an electronic device. The electronic device includes the display apparatus described above and a camera including a lens facing towards the first display region of the display apparatus. The camera is configured to obtain an external light signal transmitted through the first display region for imaging.

BRIEF DESCRIPTION OF THE DRAWINGS

In order to clearly explain technical solutions of embodiments of the present disclosure, drawings used in the description of the embodiments will be briefly described below.

DETAILED DESCRIPTION

Figure 1:
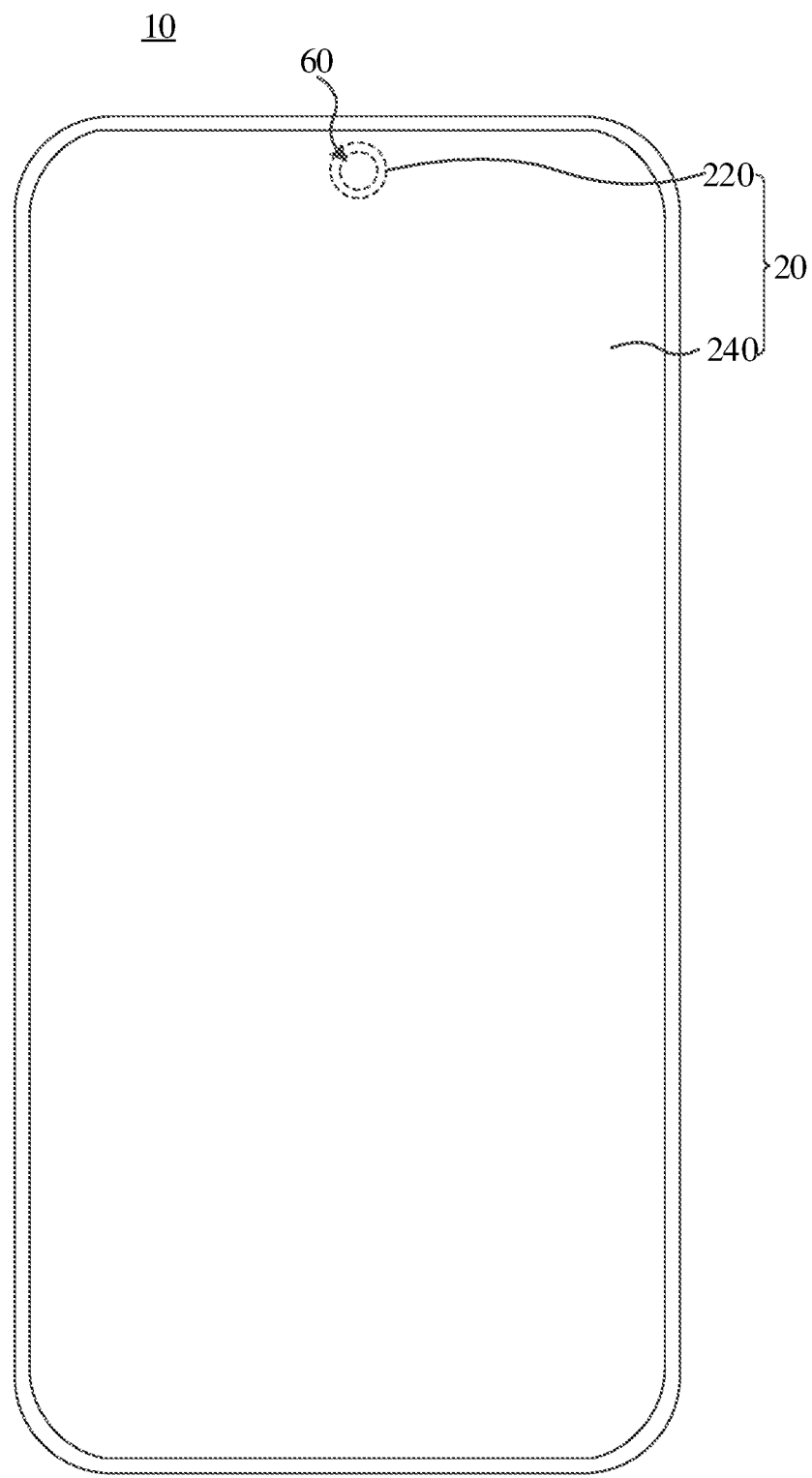
FIG. 1 is a first schematic diagram showing a structure of an electronic device according to an embodiment of the present disclosure.

An embodiment of the present disclosure provides a display apparatus. The display apparatus includes a first display region and a second display region adjoining the first display region. A light transmittance of the second display region is smaller than a light transmittance of the first display region. The second display region includes a thin film transistor. A light shielding portion is disposed between the first display region and the second display region to shield the thin film transistor in the second display region from being irradiated by a light signal from the first display region.

Here, the display apparatus further includes an anode layer and a pixel layer which adjoin each other. The light shielding portion is disposed on a side of the anode layer facing away from the pixel layer.

Here, the display apparatus further includes a first substrate and an intermediate layer. The first substrate is connected to the anode layer through the intermediate layer. The light shielding portion is disposed in the intermediate layer.

Here, the light shielding portion has one end adjoining the first substrate, and another end adjoining the anode layer or the pixel layer.

Here, the first substrate has a groove. The light shielding portion is partially disposed in the groove.

Here, the light shielding portion is perpendicular to the first substrate.

Here, the light shielding portion is disposed in the first display region and adjoins the second display region. Alternatively, the light shielding portion is disposed in the second display region and adjoins the first display region.

Here, the first display region includes a plurality of first pixels. The display apparatus further includes a first drive unit for driving the plurality of first pixels. The first drive unit is disposed outside the first display region. Here, the display apparatus includes an anode layer and a pixel layer which adjoin each other. The light shielding portion is disposed on a side of the anode layer facing away from the pixel layer. The first drive unit is disposed in the second display region and is connected to the anode layer through a connecting wire to drive the plurality of first pixels.

Here, the connecting wire is disposed in the anode layer and is disposed between the light shielding portion and the pixel layer.

Here, the first display region includes a plurality of first pixels. The display apparatus further includes a first drive unit for driving the plurality of first pixels. The first drive unit is disposed outside the first display region.

Here, the first drive unit is disposed in the second display region, and is connected to the anode layer through a connecting wire to drive the plurality of first pixels.

Here, the connecting wire is disposed in the anode layer and is disposed between the light shielding portion and the pixel layer.

Here, the connecting wire is disposed between the first substrate and the intermediate layer, and is disposed between the light shielding portion and the first substrate.

Here, the second display region includes a plurality of second pixels and a drive layer including a second drive unit. The second drive unit includes the thin film transistor and is configured to drive the plurality of second pixels. When the light shielding portion is disposed in the second display region, the light shielding portion is disposed in the drive layer.

Here, a light shielding layer is disposed between the drive layer and the plurality of second pixels. The light shielding portion adjoins the light shielding layer.

Here, the light shielding portion surrounds the first display region.

An embodiment of the present disclosure further provides a manufacturing method for a display apparatus. The manufacturing method for the display apparatus includes: providing a first substrate; forming a wiring layer on the first substrate; forming a drive layer on the wiring layer, the drive layer including a first part and a second part, and the second part including a thin film transistor, and a gap is formed between the first part and the second part by etching, and a light shielding portion is formed in the gap; forming an anode layer on the drive layer; forming a pixel layer on the anode layer; forming a common electrode layer on the pixel layer; and forming a protection layer on the common electrode layer. A region corresponding to the first part forms a first display region, and a region corresponding to the second part forms a second display region, and the thin film transistor in the second display region is shielded from being irradiated by a light signal from the first display region.

An embodiment of the present disclosure provides another manufacturing method for a display apparatus. The manufacturing method for the display apparatus includes: providing a first substrate; forming a wiring layer on the first substrate; forming a drive layer on the wiring layer, the drive layer including a first part and a second part, and the second part includes a thin film transistor; forming an anode layer on the drive layer, the anode layer including a first anode region corresponding to the first part and a second anode region corresponding to the second part, a gap being formed between the first anode region and the second anode region by etching, the gap extending through the drive layer, and a light shielding portion being formed in the gap; forming a pixel layer on the anode layer; forming a common electrode layer on the pixel layer; and forming a protection layer on the common electrode layer. A region corresponding to the first part forms a first display region, and a region corresponding to the second part forms a second display region, the thin film transistor in the second display region is shielded from being irradiated by a light signal from the first display region.

An embodiment of the present disclosure provides an electronic device. The electronic device includes the display apparatus described in any of the above embodiments and a camera including a lens facing towards the first display region of the display apparatus. The camera is configured to obtain an external light signal transmitted through the first display region for imaging.

An embodiment of the present disclosure provides an electronic device. The electronic device may include the display apparatus and the camera. A lens of the camera is disposed facing towards the display apparatus. That is, the camera obtains an external light signal transmitted through the display apparatus for imaging. It can be understood that a conventional display apparatus has a low light transmittance, and an imaging effect of the camera through the conventional display apparatus is poor. Therefore, in the embodiments of the present disclosure, a display apparatus may be partitioned. For example, a light transmittance of a portion of the display apparatus that is corresponding to the camera is set to be greater than a light transmittance of each of other positions of the display apparatus, so as to improve the imaging effect of the camera. Technical solutions according to embodiments of the present disclosure will be clearly and completely described below in combination with accompanying drawings of the embodiments of the present disclosure.

The electronic device provided in any of the embodiments of the present disclosure may be a mobile terminal device such as a mobile phone or a tablet computer, or a device having a display apparatus, such as a game device, an augmented reality (AR) device, a virtual reality (VR) device, an in-vehicle computer, a notebook computer, a data storage apparatus, an audio playing apparatus, a video playing apparatus, a wearable device, etc. The wearable device may be a smart bracelet, smart glasses, etc.

For ease of understanding, a mobile phone is taken as an example of an electronic device below for illustration. Referring to FIG. 1, FIG. 1 is a first schematic diagram showing a structure of an electronic device according to an embodiment of the present disclosure. The electronic device 10 includes a display apparatus 20. The display apparatus 20 includes a first display region 220 and a second display region 240 adjoining the first display region 220. A light transmittance of the first display region 220 is greater than that of the second display region 240. A camera 60 is disposed in the electronic device 10. The camera 60 includes a lens. The lens of the camera 60 faces towards the first display region 220. The camera 60 is configured to obtain an external light signal transmitted through the first display region 220 for imaging. That is, the camera 60 is disposed below the first display region 220 of the display apparatus 20, and is configured to obtain the external light signal transmitted through the first display region 220 of the display apparatus 20 for imaging based on the obtained external light signal. In this way, the display apparatus 20 has a complete display region, and there is no light-transparent channel incapable of displaying any image due to the camera 60. Therefore, a screen-to-body ratio of the display apparatus 20 is improved. In other words, a real full screen is provided to display an image in a full-screen manner. The camera 60 may be a front camera 60 of the electronic device 10, and may be configured to obtain a self-photographing image of a user through the first display region 220 of the display apparatus 20.

In order to more fully understand the display apparatus in the embodiments of the present disclosure, the display apparatus is described in detail below.

Figure 2:
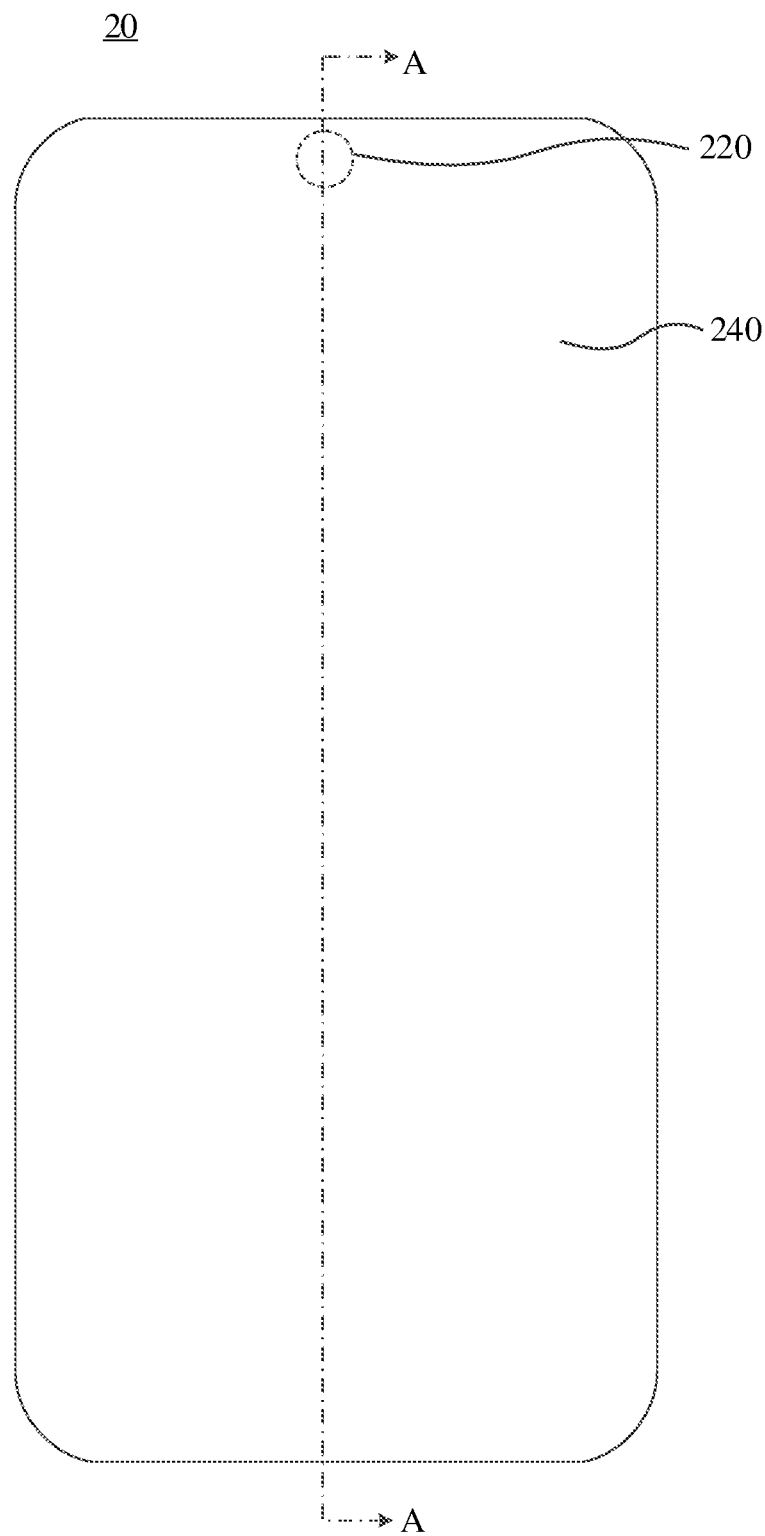
FIG. 2 is a schematic diagram showing a structure of a display apparatus of the electronic device illustrated in FIG. 1.

Referring to FIG. 2, FIG. 2 a schematic diagram showing a structure of a display apparatus of the electronic device illustrated in FIG. 1. The display apparatus 20 in the embodiments of the present disclosure may include the first display region 220 and the second display region 240 which adjoin each other. Both of the first display region 220 and the second display region 240 may be configured to display text or images. The first display region 220 and the second display region 240 may jointly display a same image. For example, the first display region 220 displays a part of a predetermined image, and the second display region 240 displays a remaining part of the predetermined image. Alternatively, the first display region 220 and the second display region 240 may display different images. For example, the first display region 220 displays a taskbar image, and the second display region 240 displays a predetermined image. In this way, both the first display region 220 and the second display region 240 may display contents, the display apparatus 20 has a complete display region and therefore has a high screen-to-body ratio. Here, the second display region 240 may surround the first display region 220, and a periphery of the first display region 220 may adjoin the second display region 240. That is, the first display region 220 is located in the second display region 240. Alternatively, the second display region 240 may partially surround the first display region 220, and a part of an edge of the first display region 220 adjoins the second display region 240. For example, the first display region 220 is located at a corner position of the display apparatus 20 or located in the middle of the top end of the display apparatus 20.

Figure 3:
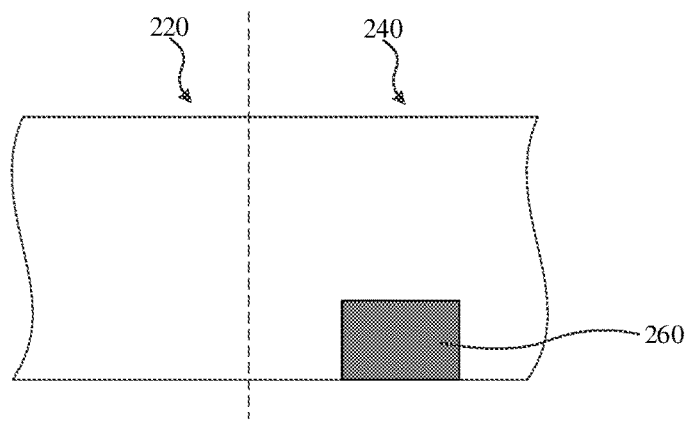
FIG. 3 is a schematic partial cross-sectional view of the display apparatus illustrated in FIG. 2 that is taken along an AA direction.

Referring to FIG. 3, FIG. 3 is a schematic partial cross-sectional view of the display apparatus illustrated in FIG. 2 that is taken along an AA direction. Here, the second display region 240 includes the thin film transistor 260. The thin film transistor 260 is configured to drive pixels of the display apparatus 20 to display an image. As an example, the thin film transistor may be configured to drive second pixels in the second display region to display an image.

In order to allow the camera 60 to obtain more external light signals, the first display region 220 as a whole may have a higher light transmittance. The external light signals may enter an interior of the electronic device through the first display region 220. When the external light signals pass through the first display region 220, due to reasons like angles of the external light signals, etc., some external light signals may be incident on the thin film transistor 260 in the second display region 240 through the first display region 220. In addition, when the first display region 220 displays an image, a light signal emitted by a first pixel 2262 in the first display region 220 is a scattered light which scatters in various directions. A part of the light signal is incident on the thin film transistor 260 in the second display region 240. The thin film transistor 260 in the second display region 240 is illuminated. Therefore, a photoelectric effect of the thin film transistor 260 is affected, causing a drain current of the thin film transistor 260 to change, and therefore causing the second pixels to generate a mura stripe under the control of the thin film transistor 260.

Figure 4:
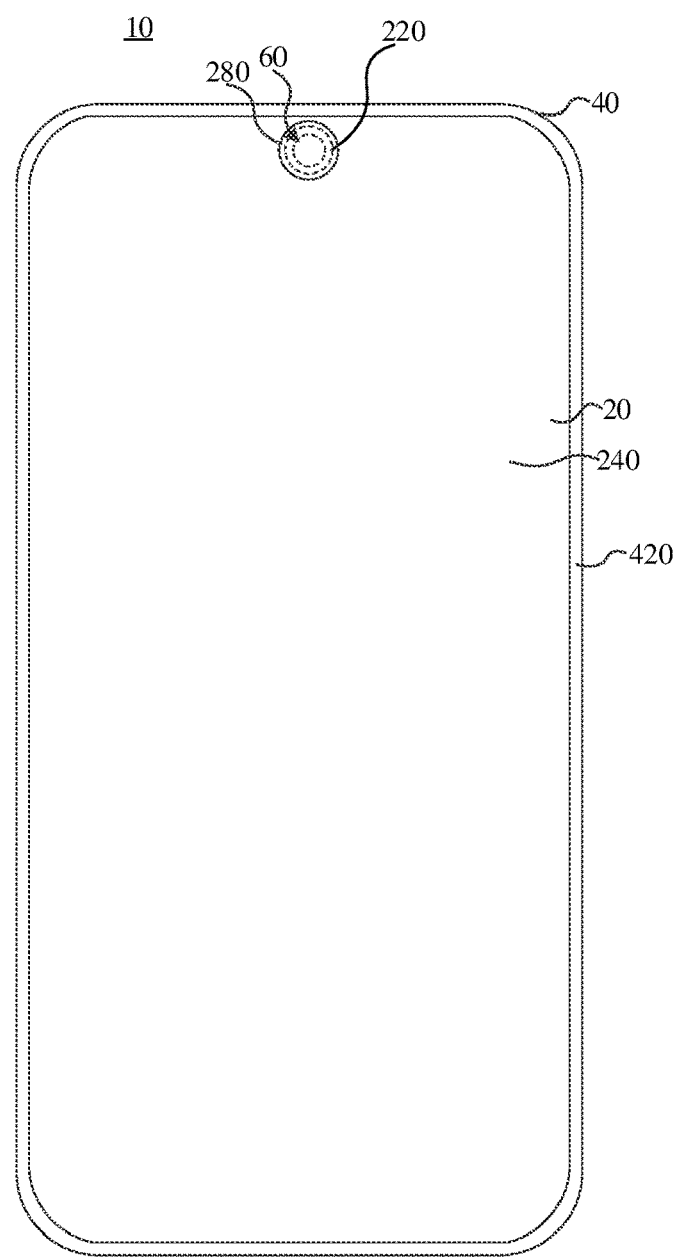
FIG. 4 is a second schematic diagram showing a structure of an electronic device according to an embodiment of the present disclosure.
Figure 5:
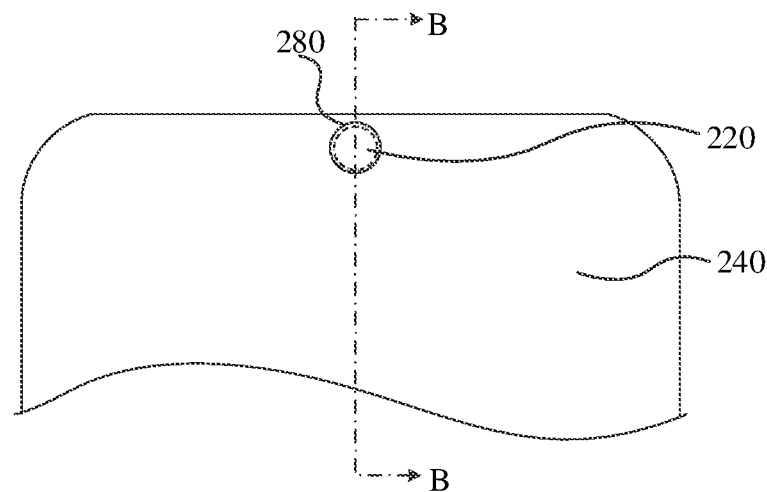
FIG. 5 is a first schematic diagram showing a part of a structure of a display apparatus of the electronic device illustrated in FIG. 4.
Figure 6:
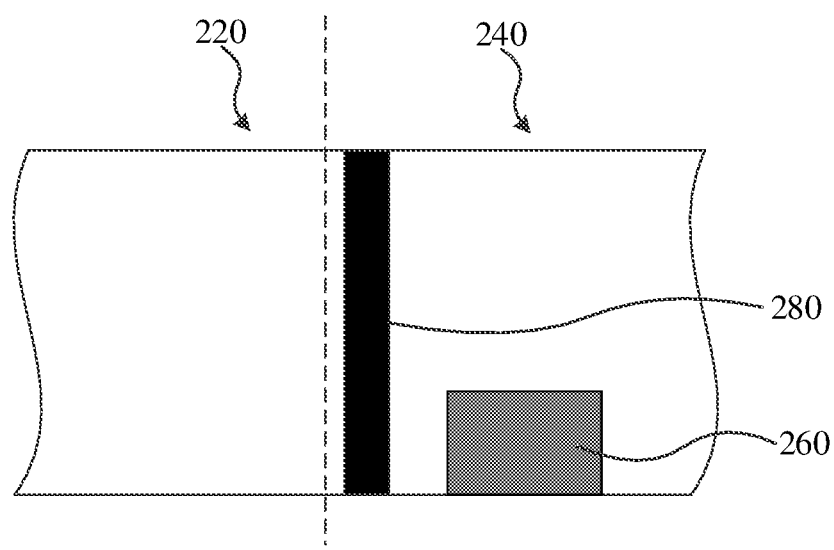
FIG. 6 is a first schematic partial cross-sectional view of the display apparatus illustrated in FIG. 5 that is taken along a BB direction.

In order to solve the above problem, a light shielding portion may be disposed between the first display region and the second display region. Referring to FIG. 4 to FIG. 6, FIG. 4 is a second schematic diagram showing a structure of an electronic device according to an embodiment of the present disclosure. FIG. 5 is a first schematic diagram showing a part of a structure of a display apparatus of the electronic device illustrated in FIG. 4. FIG. 6 is a first schematic partial cross-sectional view of the display apparatus illustrated in FIG. 5 that is taken along a BB direction. The light shielding portion 280 is disposed between the first display region 220 and the second display region 240, and is disposed around the first display region 220 to shield the thin film transistor 260 in the second display region 240 from being irradiated by a light signal from the first display region 220. In this way, it can reduce an influence on photoelectric characteristics of the thin film transistor 260 in the second display region 240 so as to ensure a display effect of the display region driven by the thin film transistor 260. In a process of the external light signal passing through the first display region 220, the light shielding portion may shield the thin film transistor 260 in the second display region 240 from being irradiated by the light signal from the first display region 220. When the first pixel in the first display region 220 emits an light signal, the light shielding portion may also shield the thin film transistor 260 in the second display region 240 from being irradiated by the light signal from the first display region 220. Therefore, an influence of the first display region 220 on the photoelectric effect of the thin film transistor 260 can be reduced, and the first display region 220 will not cause the drain current of the thin film transistor 260 to change. Therefore, when the thin film transistor 260 controls the second pixels of the second display region 240 to display contents, no mura stripe caused by incidence of the light signal on the thin film transistor 260 in the second display region 240 through the first display region 220, including the scattered light signal emitted by the first pixel 2262 in the first display region 220 and/or the external light signal entering the second display region 240 through the first display region 220, would be generated in the second display region 240.

It should be noted that, the external light signal is irregular, and the light signal emitted by the first pixel in the first display region is also irregular. Therefore, when there is no light shielding portion, the external light signal or the light signal emitted by the first pixel may be refracted and/or reflected for a plurality of times in the display apparatus before being incident on the thin film transistor. That is, the light signal incident on the first pixel of the thin film transistor is also irregular. Moreover, the first pixel includes three sub-pixels, i.e., R, G, and B sub-pixels. Ambient light changes differently after being incident on the R, G, and B sub-pixels. Light signals emitted by the R, G, and B sub-pixels are also different. Therefore, the mura stripe correspondingly generated by the thin film transistor is irregular, extremely complex, and dynamically changing. The mura stripe may not be effectively removed via a demura manner of a software. According to an embodiment of the present disclosure, the light shielding portion may prevent the display apparatus from generating an irregular mura stripe.

It can be understood that the second display region may generate Mura stripes due to a distribution of the second pixels. However, because an arrangement of the second pixels is regular, the generated corresponding mura stripes are regular, and the Mura stripes may be eliminated in the demura manner via a software.

Figure 7:
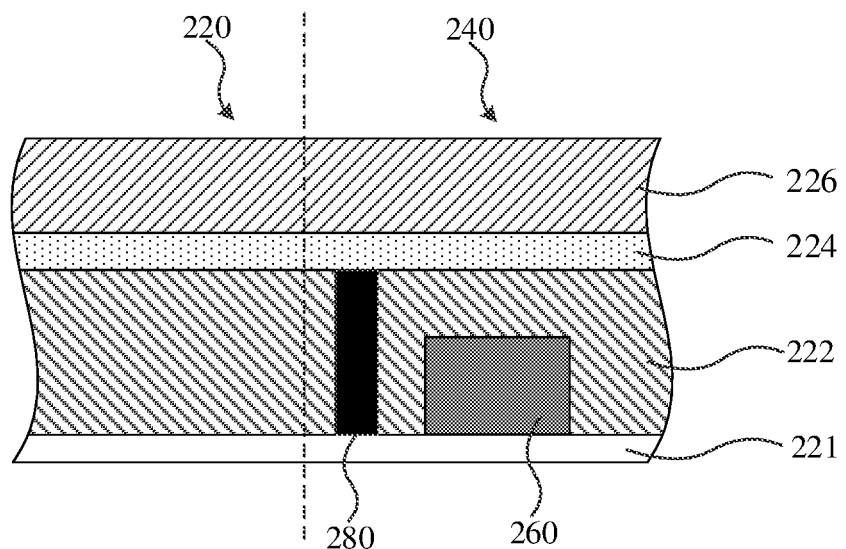
FIG. 7 is a second schematic partial cross-sectional view of the display apparatus illustrated in FIG. 5 that is taken along the BB direction.

Referring to FIG. 7, FIG. 7 is a second schematic partial cross-sectional view of the display apparatus illustrated in FIG. 5 that is taken along the BB direction. The display apparatus 20 may include an anode layer 224 and an pixel layer 226 which adjoin each other. It can be understood that since both the first display region 220 and the second display region 240 have the display function, both the anode layer 224 and the pixel layer 226 are laid in the first display region 220 and the second display region 240. The light shielding portion 280 may be disposed on a side of the anode layer 224 that faces away from the pixel layer 226. Because the thin film transistor 260 is generally disposed below the anode layer 224, that is, disposed at a side of the anode layer 224 that faces away from the pixel layer 226, the light shielding portion 280 is correspondingly disposed below the anode layer 224 to shield the thin film transistor 260 in the second display region 240 from being irradiated by the light signal from the first display region 220.

It should be noted that the anode layer 224 includes a reflective anode. The reflective anode is disposed below a corresponding pixel and is configured to reflect the light signal emitted by the pixel out of the display apparatus 20 to improve a brightness of the display apparatus 20. The reflective anode is generally made of opaque materials, such as a metals or alloy. Therefore, the light shielding portion 280 may be disposed below the anode layer 224 including the reflective anode, and thus the light shielding portion 280 will not affect an electrical connection between the anode layer 224 and the pixel layer 226. In this way, its function of shielding the second display region 240 from being irradiated by the light signal from the first display region 220 will not be affected.

Referring to FIG. 7, the display apparatus 20 further includes a first substrate 221 and an intermediate layer 222. The first substrate 221 is connected to the anode layer 224 through the intermediate layer 222. It can be understood that the display apparatus 20 includes the first substrate 221, the intermediate layer 222, the anode layer 224, and the pixel layer 226 in this order. Here, the light shielding portion 280 is disposed in the intermediate layer 222. That is, the light shielding portion 280 is disposed between the first substrate 221 and the anode layer 224.

It should be noted that the light shielding portion 280 may completely extends through the intermediate layer 222. That is, the light shielding portion 280 has one end adjoining the first substrate 221, and another end adjoining the anode layer 224 or the pixel layer 226. As an example, the intermediate layer 222 may be disposed on the first substrate 221 first, and then the intermediate layer 222 is etched to form a gap in communication with the first substrate 221, and then the light shielding portion 280 is disposed in the gap.

Figure 8:
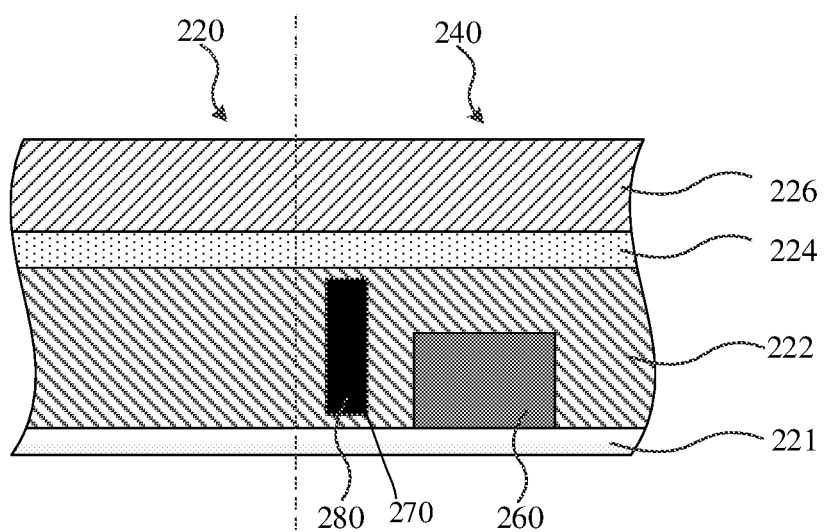
FIG. 8 is a third schematic partial cross-sectional view of the display apparatus illustrated in FIG. 5 that is taken along the BB direction.

Alternatively, the light shielding portion may be embedded in the intermediate layer. As an example, referring to FIG. 8, FIG. 8 is a third schematic partial cross-sectional view of the display apparatus illustrated in FIG. 5 that is taken along the BB direction.

The intermediate layer 222 is disposed on the first substrate 221 first. Then, the intermediate layer 222 is etched to form an accommodation groove 270 having an opening facing towards the anode layer 224. Then, the light shielding portion 280 is disposed in the accommodation groove 270, but the light shielding portion 280 does not completely fill the accommodation groove 270. Then, a same material as the intermediate layer 222 is further disposed on the light shielding portion 280, so that the light shielding portion 280 is completely disposed within the intermediate layer 222.

Alternatively, the light shielding portion may extend through a portion of the intermediate layer. For example, the intermediate layer is provided with an accommodation groove. The opening of the accommodation groove may face towards the first substrate or the anode layer. The light shielding portion is disposed in the accommodation groove. As an example, the light shielding portion may be first disposed on the first substrate, and then the intermediate layer is disposed. The intermediate layer covers the first substrate, so as to form an accommodation groove having an opening facing towards the first substrate. Alternatively, the intermediate layer may be disposed on the first substrate first, and then the intermediate layer is etched to form an accommodation groove having an opening facing towards the anode layer, and then the light shielding portion is disposed in the accommodation groove.

Figure 9:
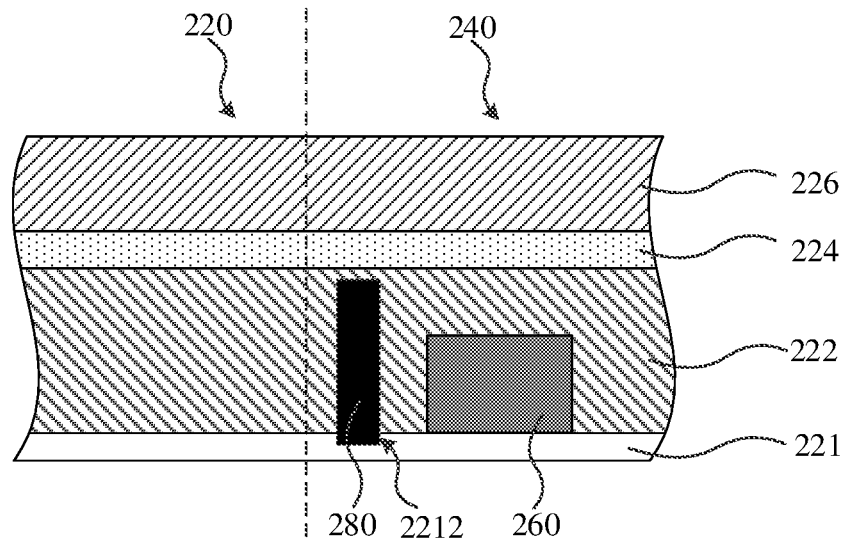
FIG. 9 is a fourth schematic partial cross-sectional view of the display apparatus illustrated in FIG. 5 that is taken along the BB direction.

The light shielding portion and the first substrate may have other mating structures. As an example, referring to FIG. 9, FIG. 9 is a fourth schematic partial cross-sectional view of the display apparatus illustrated in FIG. 5 that is taken along the BB direction. The first substrate 221 has a groove 2212. The light shielding portion 280 is partially disposed in the groove 2212. Since the first substrate 221 is generally made of a highly transparent material, such as glass, resin, etc., a part of the light signal may enter the second display region 240 from the first display region 220 through the first substrate 221, and is incident on the thin film transistor 260 in the second display region 240 after being refracted and reflected, etc. Therefore, the light shielding portion 280 is partially disposed in the groove 2212 of the first substrate 221 to block more light signals. It can be understood that an end of the light shielding portion that faces away from the first substrate may be located in the intermediate layer, or may adjoin the anode layer.

According to the embodiments of the present disclosure, the light shielding portion 280 may be perpendicular to the first substrate 221 to better shield the second display region 240 from being irradiated by the light signal from the first display region 220. Of course, the light shielding portion may not be perpendicular to the first substrate. As an example, the light shielding portion has one end adjoining the anode layer in the second display region, and another end adjoining the first substrate in the first display region. Alternatively, the light shielding portion has one end adjoining the first substrate in the first display region, and another end adjoining the anode layer in the second display region.

Figure 10:
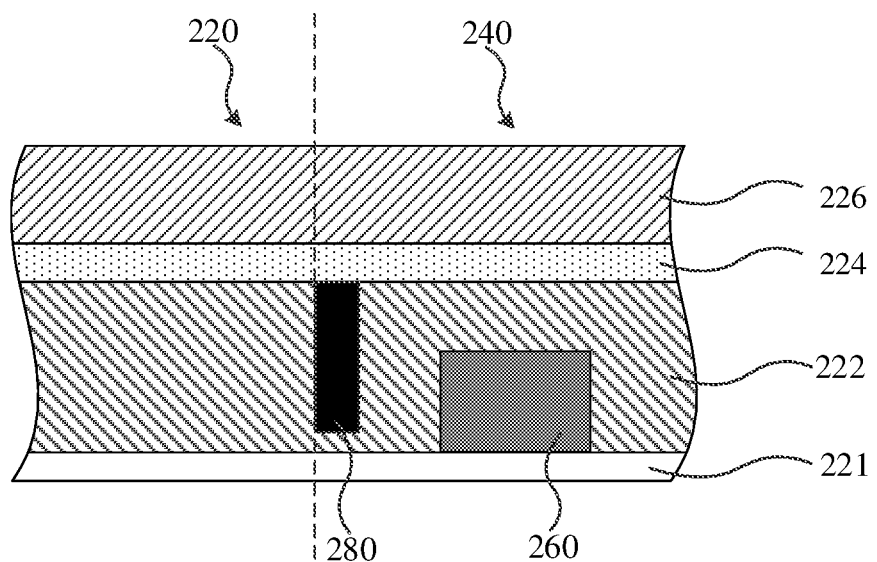
FIG. 10 is a fifth schematic partial cross-sectional view of the display apparatus illustrated in FIG. 5 that is taken along the BB direction.
Figure 11:
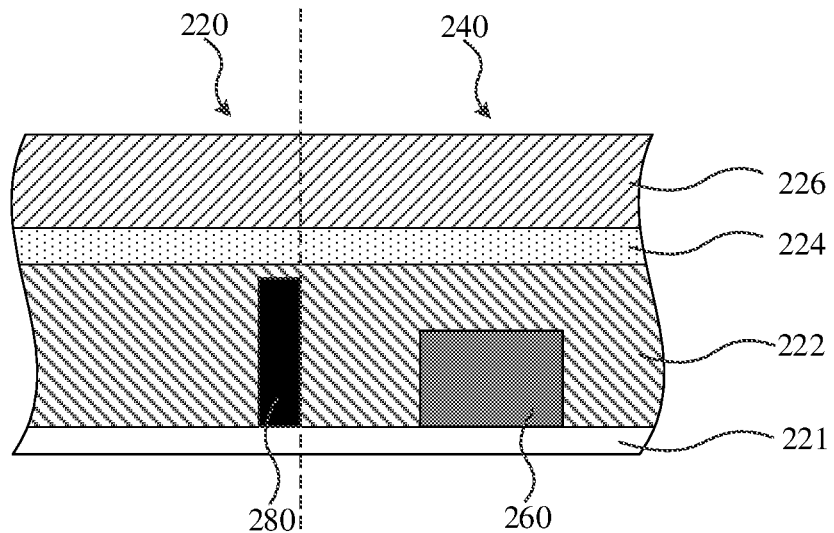
FIG. 11 is a schematic partial cross-sectional view of a display apparatus of an electronic device according to an embodiment of the present disclosure.

The light shielding portion may have a portion located in the first display region and a remaining portion located in the second display region, or may be completely located in the first display region or the second display region. For example, referring to FIG. 10, FIG. 10 is a fifth schematic partial cross-sectional view of the display apparatus illustrated in FIG. 5 that is taken along the BB direction. The light shielding portion 280 may be disposed in the second display region 240 and adjoins the first display region 220. Alternatively, the light shielding portion is disposed in the second display region, and does not adjoin the first display region. For example, referring to FIG. 11, FIG. 11 is a schematic partial cross-sectional view of a display apparatus of an electronic device according to an embodiment of the present disclosure. The light shielding portion 280 is disposed in the first display region 220 and adjoins the second display region 240. Alternatively, the light shielding portion is disposed in the first display region and does no adjoin the second display region.

A position where the light shielding portion is located may be reasonably determined based on needs to facilitate a manufacturing process. A thickness of the light shielding portion may be set as required. For example, the light shielding portion may extend through the intermediate layer, or may be disposed within the intermediate layer. The thickness of the light shielding portion is not limited herein.

The display apparatus further includes a first drive unit. The first drive unit is configured to drive a plurality of first pixels in the first display region. The first drive unit may be disposed in the first display region to more conveniently facilitate driving the plurality of first pixels. Alternatively, the first drive unit may be disposed outside the first display region to improve the light transmittance of the first display region.

Figure 12:
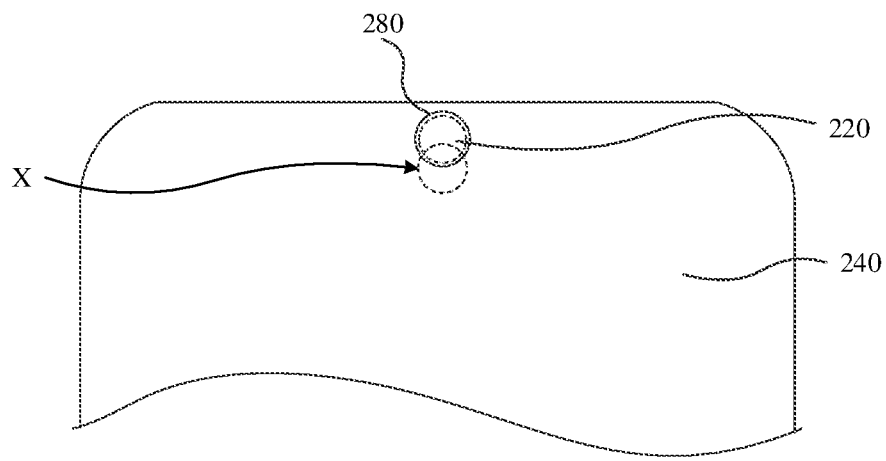
FIG. 12 is a second schematic diagram showing a part of a structure of a display apparatus of the electronic device illustrated in FIG. 4.
Figure 13:
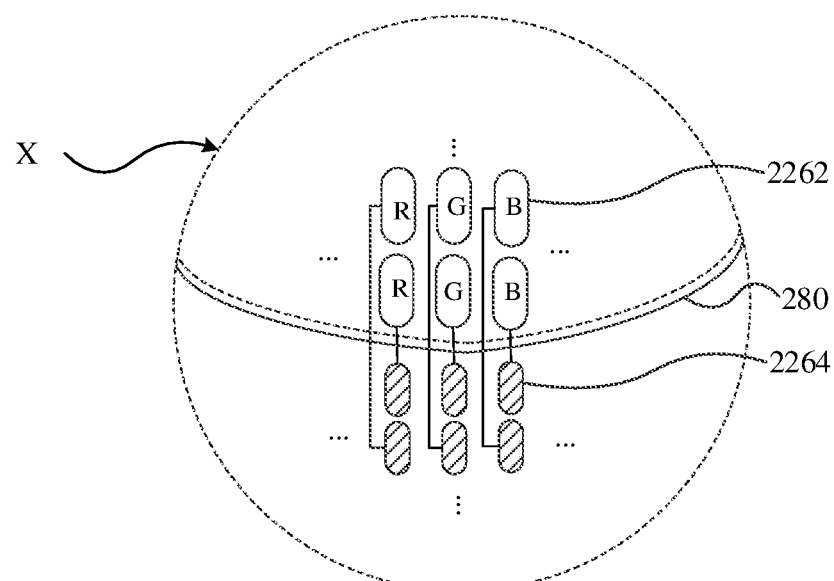
FIG. 13 is a first enlarged schematic diagram of an X portion of the display apparatus illustrated in FIG. 12.

When the first drive unit is disposed outside the first display region, the first drive unit may be disposed in the second display region or a non-display region of the display apparatus. Referring to FIG. 12 and FIG. 13, FIG. 12 is a second schematic diagram showing a part of a structure of a display apparatus of the electronic device illustrated in FIG. 4, and FIG. 13 is an enlarged schematic diagram of an X portion of the display apparatus illustrated in FIG. 12. A first drive unit 2264 is disposed in the second display region 240, and may drive a first pixel 2262.

It should be noted that the first drive unit 2264 disposed in the second display region 240 also includes a thin film transistor 260. When the thin film transistor 260 of the first drive unit 2264 is irradiated by the light signal from the first display region 220, a mura stripe may also be generated in the second display region 220, and the mura stripe is also irregular, extremely complex and dynamically changing. The light shielding portion 280 may also eliminate the mura stripe.

Specifically, the pixel layer 226 in the first display region includes a plurality of first pixels 2262. The first pixel 2262 is an organic light-emitting unit, and may include a plurality of sub-pixels (not illustrated in the figures). The first pixel 2262 may display a plurality of colors through cooperation of the plurality of sub-pixels. The first pixel 2262 may include three sub-pixels, such as a red sub-pixel, a green sub-pixel and a blue sub-pixel, or may include other sub-pixels. The first pixel 2262 includes different numbers of sub-pixels based on arrangements of different sub-pixels. For example, the first pixel 2262 may include three sub-pixels, i.e., a red sub-pixel, a green sub-pixel and a blue sub-pixel, or four sub-pixels such as a red sub-pixel, a green sub-pixel, a green sub-pixel and a blue sub-pixel, etc. The number and arrangement of sub-pixels included in first pixel 2262 are not limited herein.

Figure 14:
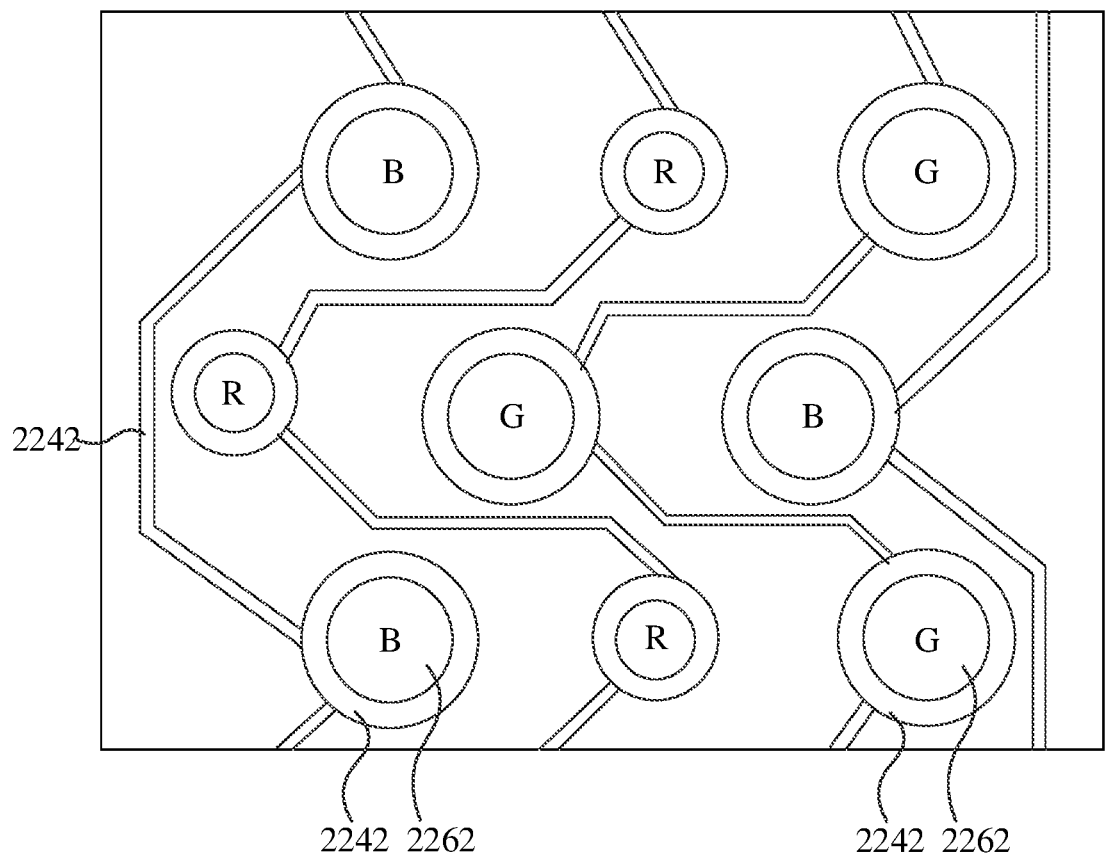
FIG. 14 is a schematic structural diagram of a first pixel and a reflective anode in a first display region of a display apparatus according to an embodiment of the present disclosure.

Referring to FIG. 14, FIG. 14 is a schematic structural diagram of a first pixel and a reflective anode in a first display region of a display apparatus according to an embodiment of the present disclosure. The anode layer 224 in the first display region includes a plurality of reflective anodes 2242. The plurality of reflective anodes 2242 are electrically connected to the plurality of first pixels 2262, that is, each reflective anode 2242 is electrically connected to one first pixel 2262. The reflective anode 2242 may be configured to drive the first pixel 2262 to emit light, and may also be configured to reflect the light signal emitted by the first pixel 2262 out to improve a luminous efficiency of the first display region 220. It can be understood that the reflective anode is formed of a material that is opaque. For example, the reflective anode is formed of an opaque metal material. For example, the reflective anode 2242 may be formed of transparent Indium Tin Oxide (ITO) material, such that the light transmittance of the first display region 220 can be improved.

The first pixel 2262 is made of an organic material. The first pixel 2262 has a high light transmittance. That is, an external light signal may pass through the first pixel 2262. However, in order to improve a display brightness of the first display region 220, the reflective anode 2242 may be disposed directly below the first pixel 2262, and has a size greater than or equal to that of the first pixel 2262. In other words, an orthographic projection of each first pixel 2262 on a corresponding anode layer 224 is located within the reflective anode 2242. In this way, the light signal emitted by the first pixel 2262 can be transmitted as much as possible to obtain a high display brightness. In addition, the first pixel 2262 includes a plurality of sub-pixels of different colors. Optical parameters of the sub-pixels of different colors are different. When the camera 60 obtains external light signals passing through the first pixels 2262 for imaging, it is difficult to process the light signals passing through the sub-pixels of different colors. In addition, the light signal that does not pass through the first pixel 2262 is also required to be processed. Therefore, by allowing the orthographic projection of each first pixel 2262 on a corresponding anode layer 224 to be located within the reflective anode 2242, it can improve an evenness of the light passing through the first display region 220 and improve quality of imaging through the first display region 220.

Figure 15:
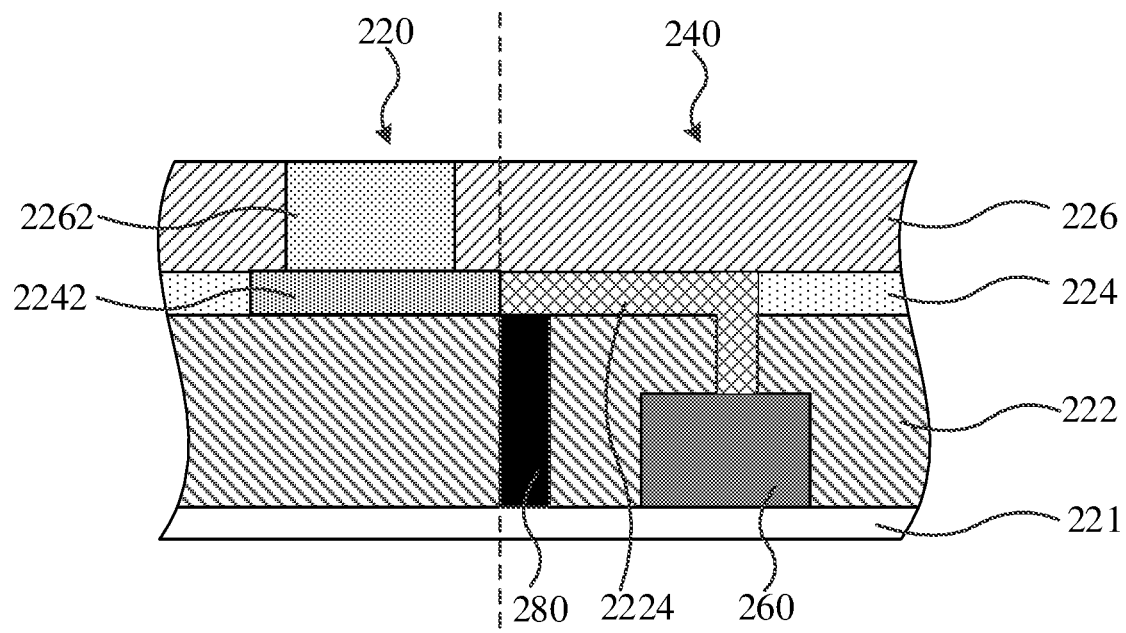
FIG. 15 is a sixth schematic partial cross-sectional view of the display apparatus illustrated in FIG. 5 that is taken alone the BB direction.

Referring to FIG. 15, FIG. 15 is a sixth schematic partial cross-sectional view of the display apparatus illustrated in FIG. 5 that is taken alone the BB direction. A first drive unit 2264 is connected to the anode layer 224 through a connecting wire 2224 to drive a plurality of first pixels 2262. The connecting wire 2224 may be disposed in the anode layer 224 and is disposed between the light shielding portion and the pixel layer 226. The connecting wire 2224 may be disposed in the anode layer 224 so as to facilitate wiring in the first display region 220.

Figure 16:
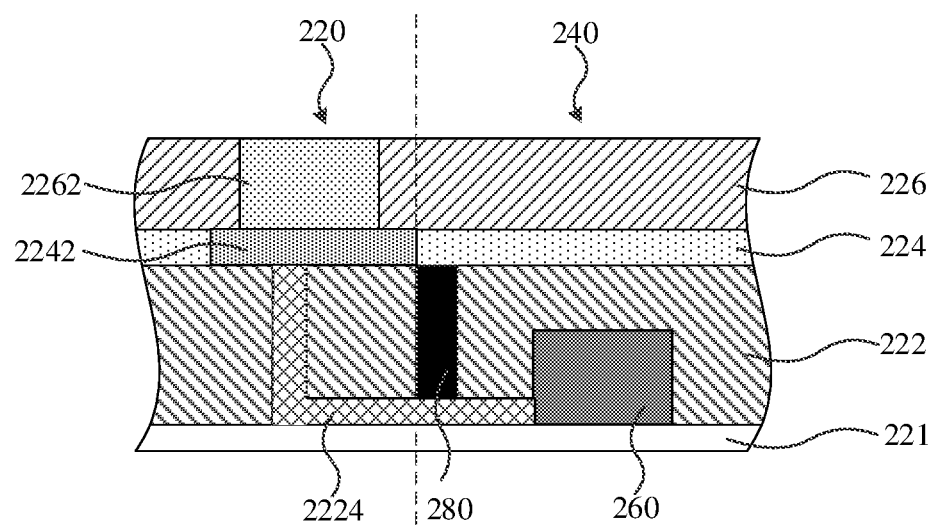
FIG. 16 is a seventh schematic partial cross-sectional view of the display apparatus illustrated in FIG. 5 that is taken along the BB direction.

Referring to FIG. 16, FIG. 16 is a seventh schematic partial cross-sectional view of the display apparatus illustrated in FIG. 5 that is taken along a BB direction. A connecting wire 2224 may be disposed between the first substrate 221 and the intermediate layer 222 and may be disposed between the light shielding portion and the first substrate 221. Since a gate line and a data line for driving a second pixel 242 are to be disposed in the second display region 240 and are disposed corresponding to each second pixel 242, and a control line corresponding to each first pixel 2262 may be arranged in the first display region 220 and may correspond to a first drive unit 2264 corresponding to the first pixel 2262, a via hole corresponding to each first pixel 2262 may be disposed in the intermediate layer 222 in the first display region 220. A conductive wire in the via hole is connected to the control wire. The control wire and the conductive wire form the connecting wire 2224 connecting the anode layer 224 of the first display region 220 and the first drive unit 2264.

Here, the connecting wire 2224 may be formed of a conductive material with a high transmittance, for example, an Indium Tin Oxide (ITO) material.

When the first drive unit is disposed in the second display region, each first drive unit may be disposed among a plurality of second drive units. In order to better arrange the first drive unit in the second display region, the first drive unit may adopt a simplified drive circuit. For example, the first drive unit may adopt a drive circuit of 2T1C or 5T1C, and the second drive unit adopts a drive circuit to obtain a better driving effect.

In order to more easily arrange the first drive unit in the second display region, the total number of the first drive units may be reduced. Specifically, a plurality of first pixels may be arranged in parallel. That is, one first drive unit may drive the plurality of first pixels, thereby reducing the number of the first drive units, and facilitating arranging the first drive unit in the second display region.

In order to better accommodate the first drive unit, the second display region may include a transition region. The transition region adjoins the first display region. A plurality of second pixels in the transition region are arranged in parallel. One second drive unit in the transition region may drive the plurality of second pixels that are connected in parallel, thereby clearing a partial space. The partial space may be used for arranging the first drive unit. Certainly, the second display region may not have the transition region, and the first drive unit is arranged in a gap of the second display region.

Figure 17:
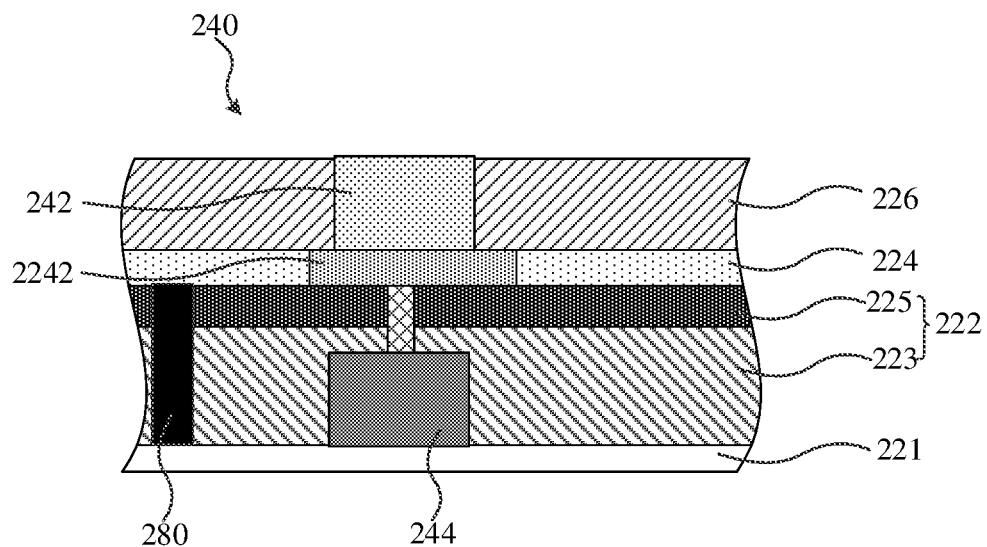
FIG. 17 a first schematic partial cross-sectional view of a second display region of a display apparatus according to an embodiment of the present disclosure.

Referring to FIG. 17, FIG. 17 a first schematic partial cross-sectional view of a second display region of a display apparatus according to an embodiment of the present disclosure. The pixel layer 226 of the second display region 240 includes a plurality of second pixels 242. The second display region 240 includes a drive layer 223. The drive layer 223 includes a second drive unit 244. The second drive unit 244 is configured to drive the plurality of second pixels 242. The second drive unit 244 includes a thin film transistor. When the light shielding portion 280 is disposed in the second display region 240, the light shielding portion 280 is disposed in the drive layer 223.

The intermediate layer 222 of the second display region 240 includes a plurality of layer structures. For example, the intermediate layer 222 may further include an insulating layer 225 in addition to the drive layer 223. In some other embodiments, the intermediate layer may further include a gate line layer, a data line layer, and a plurality of insulating layers. The light shielding portion 280 may be disposed in the drive layer 223 without affecting other layer structures. Certainly, in addition to being disposed in the drive layer 223, the light shielding portion 280 may also extend through another layer structure to block more light signals.

Here, when the first drive unit is not disposed in the first display region, the first display region does not have a drive layer and is only filled with a material with high light transmittance.

Figure 18:
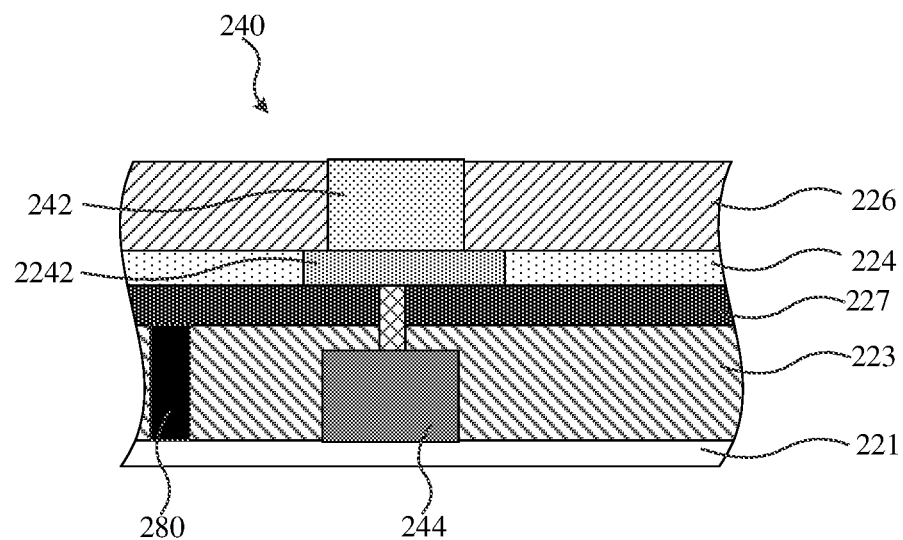
FIG. 18 is a second schematic partial cross-sectional view of a second display region of a display apparatus according to an embodiment of the present disclosure.

In some embodiments, referring to FIG. 18, FIG. 18 is a second schematic partial cross-sectional view of a second display region of a display apparatus according to an embodiment of the present disclosure.

A light shielding layer 227 may be disposed between the drive layer 223 in the second display region 240 and the pixel layer 226, so that an external light signal or a light signal emitted by the second pixel 242 will not incident onto the second drive unit 244. When the light shielding portion 280 is disposed in the second display region 240, the light shielding portion 280 may adjoin the light shielding layer 227. The light shielding layer 227 may be made of a light shielding insulating material, therefore the light shielding layer 227 may achieve a light shielding effect and an insulating effect. The light shielding layer may directly adjoin the anode layer. In some other embodiments, in addition to the anode layer, an insulating layer may be disposed between the light shielding layer and the pixel layer. Certainly, the light shielding portion may extend through the light shielding layer, or may be partially disposed in the light shielding layer. It can be understood that the light shielding layer may not disposed in the first display region to improve the light transmittance.

Figure 19:
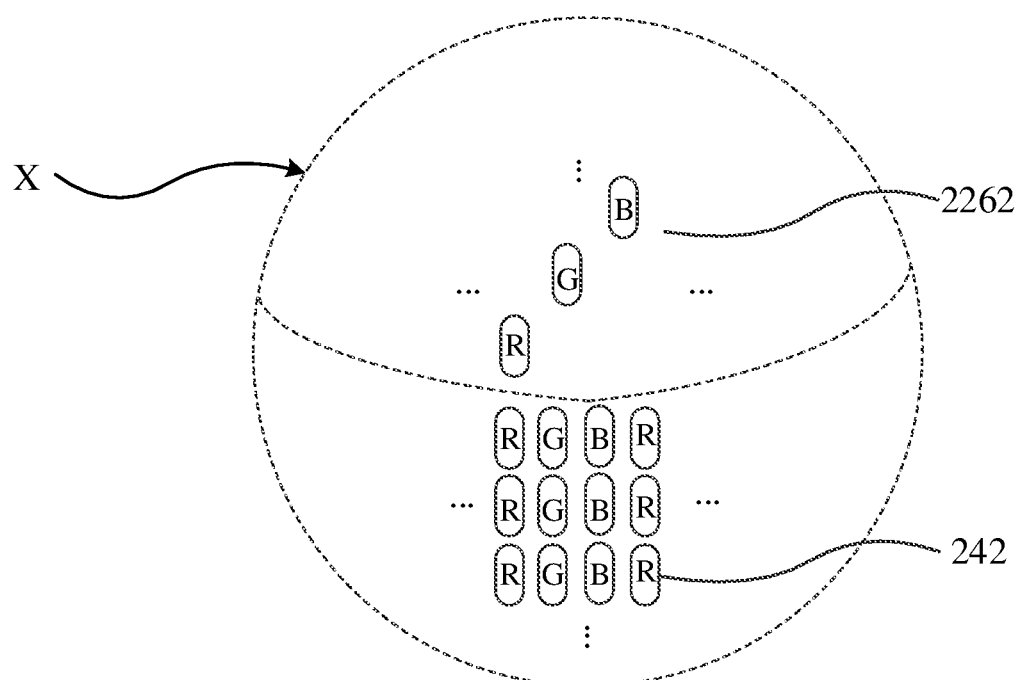
FIG. 19 is a second enlarged schematic diagram of the X portion of the display apparatus illustrated in FIG. 12.
Figure 20:
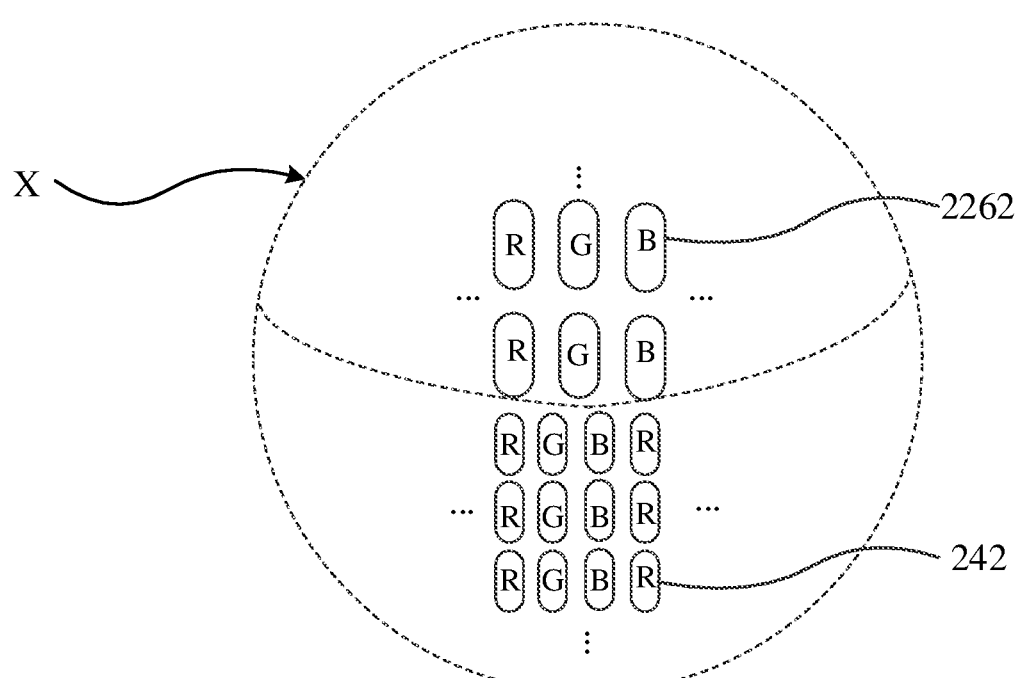
FIG. 20 is a third enlarged schematic diagram of the X portion of the display apparatus illustrated in FIG. 12.

The light transmittance of the second display region is smaller than the light transmittance of the first display region, which may be achieved by adopting a plurality of structures. Here, it can be implemented by a structure of pixel distribution density. Specifically, a distribution density of the plurality of second pixels in the second display region is greater than a distribution density of the plurality of first pixels in the first display region. As an example, referring to FIG. 19, FIG. 19 is a second enlarged schematic diagram of the X portion of the display apparatus illustrated in FIG. 12. A size of the second pixel 242 may be the same as a size of the first pixel 2262. A spacing between the first pixels 2262 in the first display region 220 is large, which may improve the light transmittance of the first display region 220. For example, the distribution density of the first pixels 2262 in the first display region 220 is 200 ppi. The distribution density of the second pixels 242 in the second display region 240 may be greater than 400 ppi. In another example, referring to FIG. 20, FIG. 20 is a third enlarged schematic diagram of the X portion of the display apparatus illustrated in FIG. 12. The size of the first pixel 2262 in the first display region 220 may be greater than the size of the second pixel 242 in the second display region 240. The spacing between the first pixels 2262 is positively correlated with the size of the first pixel 2262. That is, a larger size of the first pixel 2262 leads to a larger spacing distance between the first pixels 2262. Therefore, the distribution density of the first pixels 2262 in the first display region 220 is smaller than the distribution density of the second pixels 242 in the second display region 240.

It can be understood that the distribution density of the first pixels in the first display region is smaller than the distribution density of the second pixels in the second display region. A smaller distribution density of the first pixels leads to a larger region with higher light transmittance among the first pixels, therefore the light transmittance of the first display region is greater than that of the second display region. Moreover, the first drive unit for driving the plurality of first pixels is disposed outside the first display region. The second drive unit for driving the second pixels is disposed in the second display region. Therefore, the light transmittance of the first display region is greater than that of the second display region.

Figure 21:
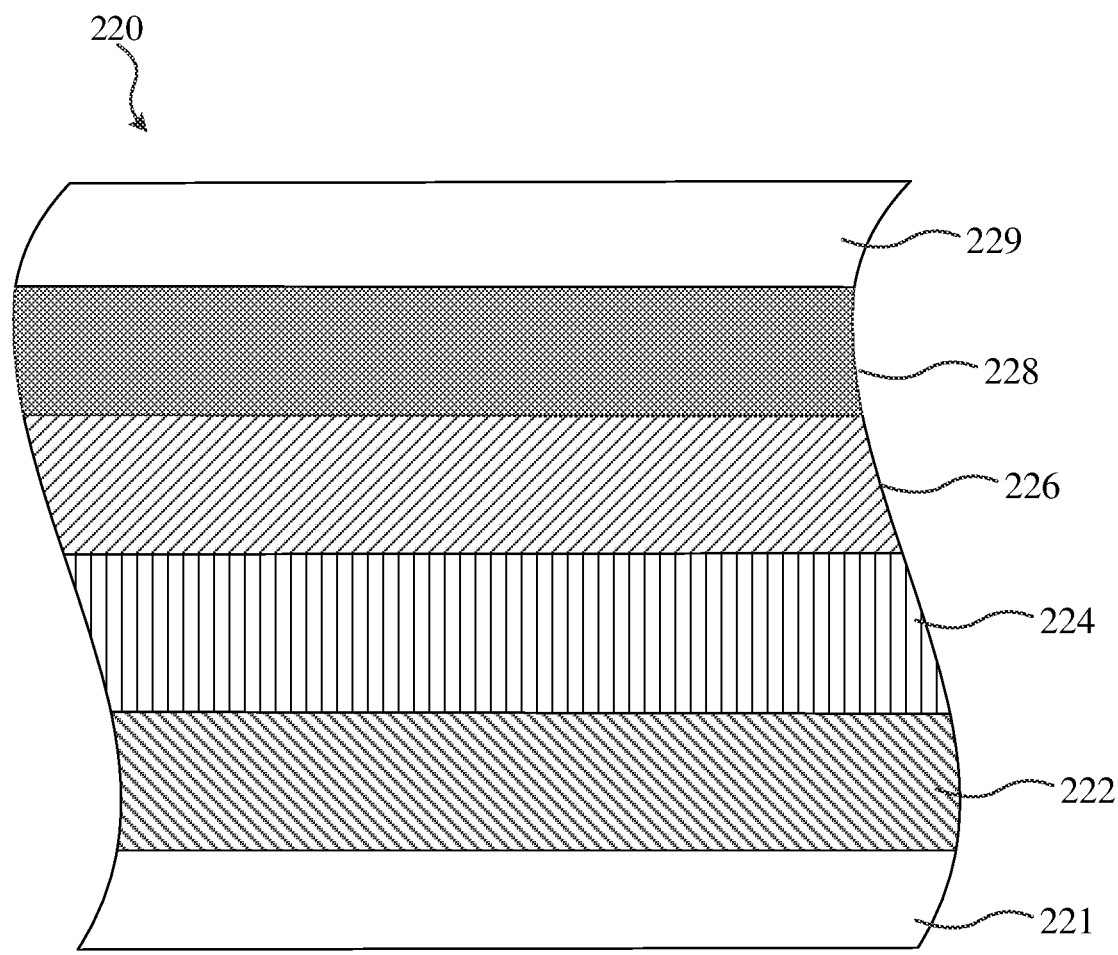
FIG. 21 is a schematic diagram showing a stacked structure of a first display region of the display apparatus illustrated in FIG. 2.

In order to better understand a structure of the first display region, referring to FIG. 21, FIG. 21 is a schematic diagram showing a stacked structure of a first display region of the display apparatus illustrated in FIG. 2. The first display region 220 includes the first substrate 221, the intermediate layer 222, the anode layer 224, the pixel layer 226, the common electrode layer 228 and a second substrate 229 arranged in sequence. The common electrode layer 228 and the anode layer 224 are used for jointly driving the first pixel of the pixel layer 226 to display a content. The first drive unit for driving the first pixel is disposed outside the first display region 220 to improve the light transmittance of the first display region 220. Moreover, a layer structure of the first display region 220 is simple, which facilitates the light evenly passing through the first display region 220. The intermediate layer 222 may be formed of an insulating material having a high transmittance. In some other embodiments, a part of the layer structure may be adjusted as required. For example, the second substrate may not be disposed in the first display region.

It should be noted that the first display region may adopt another structure to improve the light transmittance thereof, and details thereof will be omitted herein. The structure of the first display region is not limited in the embodiments of the present disclosure, any structure that may provide the light transmittance of the first display region is within the scope of the present disclosure.

It can be understood that in any one of the above embodiments, a size and shape of the first pixel in the first display region may be set as required. For example, the first pixel may have a rectangular shape or a quasi-circular shape. The first pixel that is quasi-circular may be in a shape of a circle, ellipse, or rounded rectangle, etc. The first pixel that is quasi-circular may ameliorate a diffraction problem of the first display region because an edge thereof is arcuate.

The display apparatus may be in a regular shape. For example, the display apparatus is in a shape of a rectangle, rounded rectangle, or circle. Certainly, in some other possible embodiments, the display apparatus may be in a non-regular shape, which is not limited in the embodiments of the present disclosure.

Figure 22:
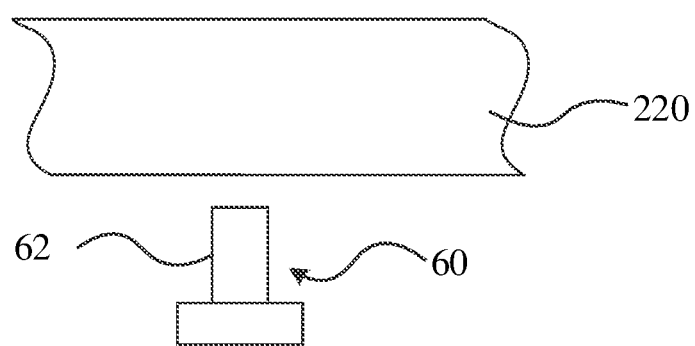
FIG. 22 is a schematic diagram showing a structure of a first display region and a camera which cooperate with each other in the electronic device illustrated in FIG. 4.

Referring to FIG. 22, FIG. 22 is a schematic diagram showing a structure of a first display region and a camera which cooperate with each other in the electronic device illustrated in FIG. 4. The camera 60 includes a lens 62. The lens 62 faces towards the first display region 220 of the display apparatus. The camera 60 is configured to obtain an external light signal transmitted through the first display region 220 for imaging. The camera 60 facing towards the first display region may be used as a front camera of the electronic device. In order to reduce a space occupied by the camera, the lens 62 of the camera 60 may be close to or adjoin the display apparatus.

It should be noted that, one camera or a plurality of cameras may be disposed below the first display region. The plurality of cameras may cooperate with each other, such as two identical cameras, a common camera and a blurring camera or a black-and-white camera, etc. Other functional devices may be disposed below the first display region in addition to the one camera or the plurality of cameras, such as a proximity sensor, a light sensor, a distance measurement sensor, a fingerprint recognition sensor, etc.

In order to more fully understand the electronic device in the embodiments of the present disclosure, a structure of the electronic device will be further described below. Referring to FIG. 1, the electronic device 10 further includes a housing 40 and the camera 60.

The housing 40 may include a rear cover (not illustrated) and a frame 420. The frame 420 is disposed around a periphery of the rear cover. The display apparatus 20 may be disposed in the frame 420. The display apparatus 20 and the rear cover may serve as two opposite surfaces of the electronic device 10. The camera 60 is disposed between the rear cover of the housing 40 and the display apparatus 20. The display apparatus 20 may be an organic light-emitting diode (OLED) display apparatus 20. The display apparatus 20 may be a full-screen display apparatus. That is, basically the whole display surface of the display apparatus 20 is a display area. A cover plate may be disposed on the display apparatus 20. The cover plate covers the display apparatus 20 to protect the display apparatus 20 and prevent the display apparatus 20 from being scratched or damaged by water. The cover plate may be a transparent glass cover plate, so that the user may observe information displayed by the display apparatus 20 through the cover plate. For example, the cover plate may be a cover plate made of sapphire.

The electronic device may further include a circuit board, a battery, and a middle plate. The middle plate is enclosed by the frame 420. The frame 420 may form a middle frame of the electronic device 10 together with the middle plate. The middle plate and the frame 420 together may define two accommodation cavities that are respectively on two sides of the middle plate. One of the two accommodation cavities is used for accommodating the display apparatus 20, and the other of the two accommodation cavities is used for accommodating the circuit board, the battery and other electronic components or functional components of the electronic device 10.

The middle plate may be a thin plate-shaped or sheet-shaped structure, or a hollow frame structure. The middle frame is used for providing support for the electronic components or functional components in the electronic device 10, such that the electronic components and functional components in the electronic device 10 can be mounted together. The camera 60, a receiver, the battery and other functional components of the electronic device 10 may all be mounted on the middle frame or the circuit board to be fixed. It can be understood that the middle frame may be made of a material including metal or plastic, etc.

The circuit board may be mounted on the middle frame. The circuit board may be a mainboard of the electronic device 10. One or more functional components such as a microphone, a speaker, a receiver, an earphone interface, an acceleration sensor, a gyroscope, and a processor may be integrated on the circuit board. Meanwhile, the display apparatus 20 may be electrically connected to the circuit board to control a display of the display apparatus 20 via the processor on the circuit board. The display apparatus 20 and the camera 60 may both be electrically connected to the processor. When the processor receives a photographing instruction, the processor disables the display of the first display region, and controls the camera 60 to collect an image through the first display region. When the processor does not receive the photographing instruction and receives an instruction for displaying an image, the processor controls the first display region and the second display region to jointly display the image.

The battery may be mounted on the middle frame. Meanwhile, the battery is electrically connected to the circuit board to supply power to the electronic device 10. A power management circuit may be disposed on the circuit board. The power management circuit is configured to distribute a voltage provided by the battery to various electronic components in the electronic device 10.

Figure 23:
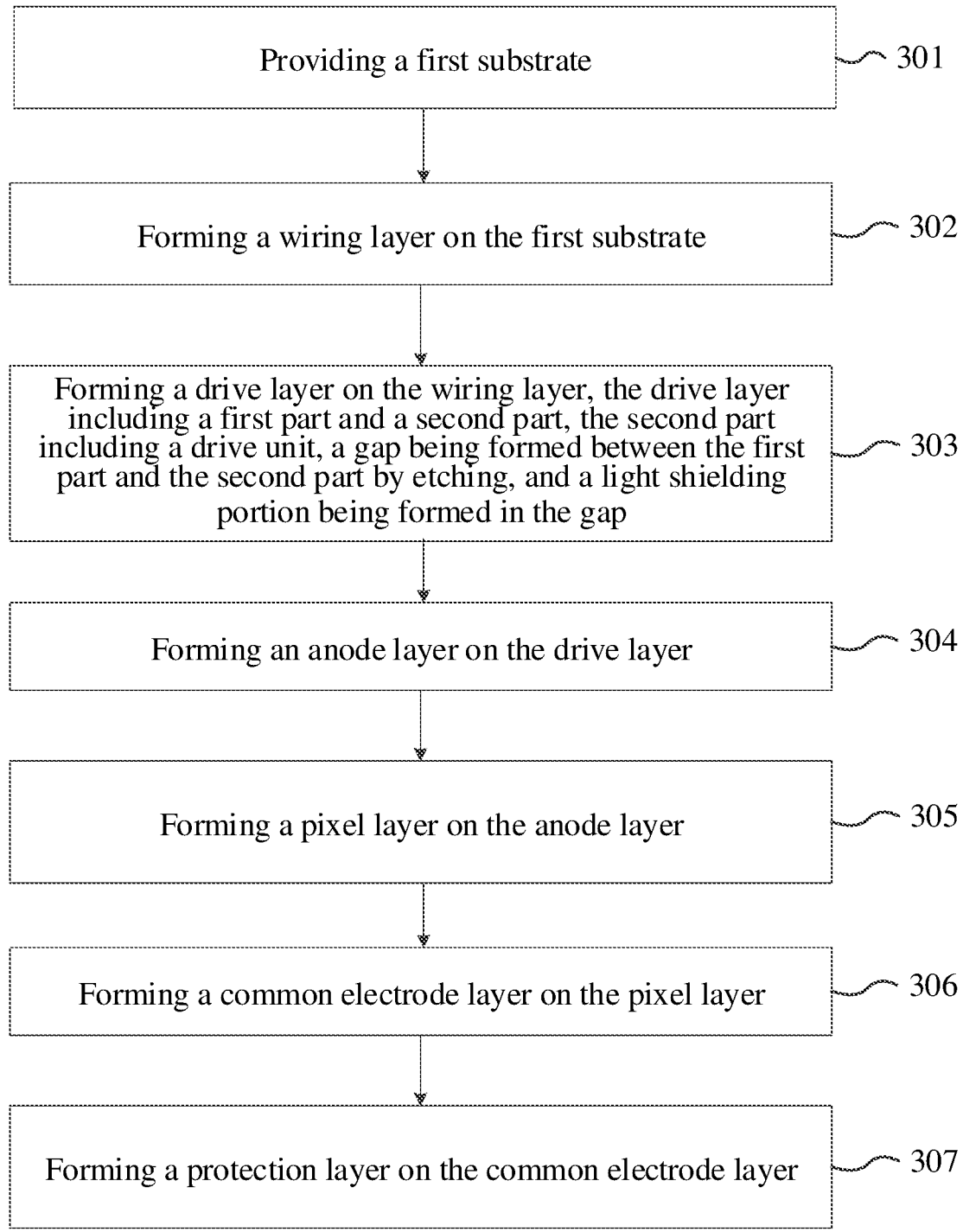
FIG. 23 is a schematic flowchart of a manufacturing method for a display apparatus according to an embodiment of the present disclosure.

According to an embodiment of the present disclosure, a manufacturing method for a display apparatus is provided. Referring to FIG. 23, FIG. 23 is a schematic flowchart of a manufacturing method for a display apparatus according to an embodiment of the present disclosure. The manufacturing method for the display apparatus specifically includes the following steps.

At 301, a first substrate is provided. The first substrate may be formed of a material such as glass or resin. The first substrate may have a rigid structure or a flexible structure. It can also be understood that the formed display apparatus may be a rigid display apparatus or a flexible display apparatus. For example, the display apparatus may be a bendable display apparatus or a rollable display apparatus.

At 302, a wiring layer is formed on the first substrate. The wiring layer may include a gate line, a data line, etc., which is not limited herein.

At 303, a drive layer is formed on the wiring layer. The drive layer includes a first part and a second part. The second part includes a thin film transistor. A gap is formed between the first part and the second part by etching. A light shielding portion is formed in the gap. The thin film transistor may be included in the second part of the drive layer. It can be understood that the thin film transistor may not be disposed in the first part, and only a material with high light transmittance is disposed in the first part.

At 304, an anode layer is formed on the drive layer. A reflective anode in the anode layer is electrically connected to the thin film transistor.

At 305, a pixel layer is formed on the anode layer. Pixels in the pixel layer adjoin the reflective anode and are electrically connected to the reflective anode.

At 306, a common electrode layer is formed on the pixel layer. The common electrode layer and the anode layer may be used for jointly driving pixels in the pixel layer.

At 307, a protection layer is formed on the common electrode layer. The protection layer may protect the common electrode layer. The protection layer may be formed of a material such as glass or resin.

Here, a region corresponding to the first part forms a first display region, and a region corresponding to the second part forms a second display region. The thin film transistor in the second display region is to shielded from being irradiated by a light signal from the first display region. It can be understood that the thin film transistor in the second part may form a first drive unit that drives a first pixel in the first display region, and a second drive unit that drives a second pixel in the second display region.

It should be noted that the manufacturing method for the display apparatus in the embodiment may obtain the display apparatus in any one of the above embodiments. It can be understood that, in order to obtain the display apparatus in any one of the above embodiments, the manufacturing method for the display apparatus in the embodiment may be correspondingly adjusted, and details are not described herein again.

Figure 24:
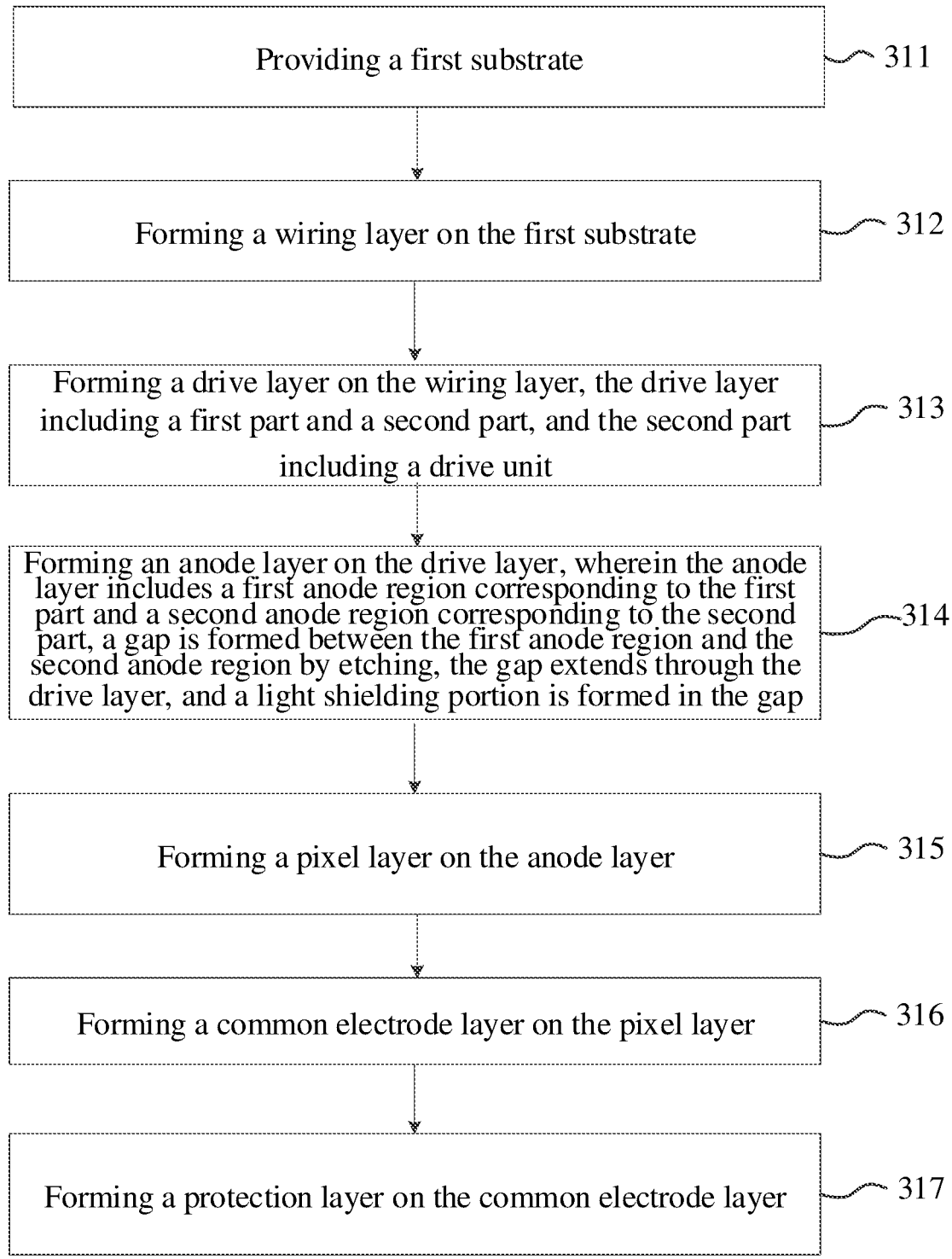
FIG. 24 is a schematic flowchart of another manufacturing method for a display apparatus according to an embodiment of the present disclosure.

According to an embodiment of the present disclosure, a manufacturing method for a display apparatus is provided. The manufacturing method differs from the manufacturing method for the display apparatus in the above embodiment mainly in a part accommodating the light shielding portion. Specifically, referring to FIG. 24, FIG. 24 is a schematic flowchart of another manufacturing method for a display apparatus according to an embodiment of the present disclosure. The manufacturing method for the display apparatus specifically includes the following steps.

At 311, a first substrate is provided. The first substrate may be formed of a material such as glass or resin. The first substrate may have a rigid structure or a flexible structure.

At 312, a wiring layer is formed on the first substrate. The wiring layer may include a gate line, a data line, etc., which is not limited herein.

At 313, a drive layer is formed on the wiring layer. The drive layer includes a first part and a second part. The second part includes a thin film transistor. The second part in the drive layer may include a thin film transistor. It can be understood that the thin film transistor may not be disposed in the first part, and only a material with high light transmittance is disposed in the first part.

At 314, an anode layer is formed on the drive layer. The anode layer includes a first anode region corresponding to the first part and a second anode region corresponding to the second part. A gap is formed between the first anode region and the second anode region by etching. The gap extends through the drive layer. A light shielding portion is formed in the gap. A reflective anode in the anode layer is electrically connected to the thin film transistor.

At 315, a pixel layer is formed on the anode layer. Pixels in the pixel layer adjoin the reflective anode and are electrically connected to the reflective anode.

At 316, a common electrode layer is formed on the pixel layer. The common electrode layer and the anode layer may be used for jointly driving the pixels in the pixel layer.

At 317, a protection layer is formed on the common electrode layer. The protection layer may protect the common electrode layer. The protection layer may be formed of a material such as glass or resin.

Here, a region corresponding to the first part forms a first display region, and a region corresponding to the second part forms the second display region. The thin film transistor in the second display region is to shielded from being irradiated by a light signal from the first display region. It can be understood that the thin film transistor in the second part may form a first drive unit that drives a first pixel in the first display region, and a second drive unit that drives a second pixel in the second display region.

It should be noted that the manufacturing method for the display apparatus in the embodiment may obtain the display apparatus in any one of the above embodiments. It can be understood that, in order to obtain the display apparatus in any one of the above embodiments, the manufacturing method for the display apparatus in the embodiment may be correspondingly adjusted, which are not described herein again.

It should be understood that "a plurality of" in the description refers to two or more than two.

The above provides detailed description of the display apparatus, the manufacturing method for the display apparatus, and the electronic device provided by the embodiments of the present disclosure. Specific examples are used herein to illustrate the principles and implementations of the present disclosure. The description of the above embodiments is only used to facilitate understanding of the present disclosure. In addition, for those skilled in the art, according to the concept of the present disclosure, changes can be made to the specific implementations and the scope of application. In summary, the content of the specification should not be construed as a limitation to the present disclosure.

What is claimed is:

1. A display apparatus, having a first display region and a second display region adjoining the first display region, a light transmittance of the second display region being smaller than a light transmittance of the first display region, the display apparatus comprising:
   a thin film transistor disposed in the second display region; and
   a light shielding portion disposed between the first display region and the second display region and configured to shield the thin film transistor in the second display region from being irradiated by a light signal from the first display region;

wherein the display apparatus further comprises:
   an anode layer and a pixel layer which adjoin each other, the light shielding portion being disposed on a side of the anode layer facing away from the pixel layer; and
   a first substrate connected to the anode layer;
   wherein the light shielding portion has one end adjoining the first substrate, and another end adjoining the anode layer or the pixel layer.

2. The display apparatus according to claim 1, further comprising:
   a plurality of first pixels disposed in the first display region; and
   a first drive unit disposed outside the first display region and configured to drive the plurality of first pixels.

3. The display apparatus according to claim 2, wherein the first drive unit is disposed in the second display region and is connected to the anode layer through a connecting wire to drive the plurality of first pixels.

4. The display apparatus according to claim 3, wherein the connecting wire is disposed in the anode layer and is disposed between the light shielding portion and the pixel layer.

5. The display apparatus according to claim 1, further comprising an intermediate layer, wherein the first substrate is connected to the anode layer through the intermediate layer, and the light shielding portion is disposed in the intermediate layer.

6. The display apparatus according to claim 5, wherein the first substrate has a groove, and the light shielding portion is partially disposed in the groove.

7. The display apparatus according to claim 5, wherein the light shielding portion is perpendicular to the first substrate.

8. The display apparatus according to claim 5, wherein the light shielding portion has a portion located in the first display region and a remaining portion located in the second display region, or
   the light shielding portion is completely located in the first display region or the second display region.

9. The display apparatus according to claim 8, wherein the light shielding portion is disposed in the first display region and adjoins the second display region; or
   the light shielding portion is disposed in the second display region and adjoins the first display region.

10. The display apparatus according to claim 2, further comprising:
    a plurality of second pixels disposed in the second display region; and
    a drive layer disposed in the second display region and comprising a second drive unit, the second drive unit comprising the thin film transistor and configured to drive the plurality of second pixels,
    wherein when the light shielding portion is disposed in the second display region, the light shielding portion is disposed in the drive layer.

11. The display apparatus according to claim 10, further comprising a light shielding layer disposed between the drive layer and the plurality of second pixels, wherein the light shielding portion adjoins the light shielding layer.

12. The display apparatus according to claim 10, wherein a distribution density of the plurality of second pixels in the second display region is greater than a distribution density of the plurality of first pixels in the first display region.

13. The display apparatus according to claim 10, wherein a size of a first pixel of the plurality of first pixels in the first display region is greater than a size of a second pixel of the plurality of second pixels in the second display region, and a spacing between the first pixels is positively correlated with the size of the first pixels.

14. The display apparatus according to claim 1, wherein the light shielding portion surrounds the first display region.

15. The display apparatus according to claim 2, wherein the anode layer in the first display region includes a plurality of reflective anodes, the plurality of reflective anodes are electrically connected to the plurality of first pixels, each of the plurality of reflective anodes is disposed directly below a corresponding one of the plurality of first pixels, and has a size greater than or equal to the corresponding one of the plurality of first pixels.

16. The display apparatus according to claim 2, wherein a first pixel of the plurality of first pixels has a rectangular shape or a quasi-circular shape.

17. A manufacturing method for a display apparatus, comprising:
providing a first substrate;
forming a wiring layer on the first substrate;
forming a drive layer on the wiring layer, the drive layer comprising a first part and a second part, and the second part comprising a thin film transistor, and a gap is formed between the first part and the second part by etching, and a light shielding portion is formed in the gap;
forming an anode layer on the drive layer;
forming a pixel layer on the anode layer;
forming a common electrode layer on the pixel layer; and
forming a protection layer on the common electrode layer;
wherein a region corresponding to the first part forms a first display region, and a region corresponding to the second part forms a second display region, the second display region being shielded from being irradiated by a light signal from the first display region;
wherein the light shielding portion has one end adjoining the first substrate, and another end adjoining the anode layer or the pixel layer.

18. An electronic device, comprising:
a display apparatus having a first display region and a second display region adjoining the first display region, a light transmittance of the second display region being smaller than a light transmittance of the first display region, the display apparatus comprising:
a thin film transistor disposed in the second display region; and
a light shielding portion disposed between the first display region and the second display region and configured to shield the thin film transistor in the second display region from being irradiated by a light signal from the first display region; and
a camera comprising a lens facing towards the first display region of the display apparatus, the camera being configured to obtain an external light signal transmitted through the first display region for imaging;
wherein the display apparatus further comprises:
an anode layer and a pixel layer which adjoin each other, the light shielding portion being disposed on a side of the anode layer facing away from the pixel layer; and
a first substrate connected to the anode layer;
wherein the light shielding portion has one end adjoining the first substrate, and another end adjoining the anode layer or the pixel layer.

* * * * *